US006730541B2

(12) United States Patent
Heinen et al.

(10) Patent No.: US 6,730,541 B2
(45) Date of Patent: May 4, 2004

(54) WAFER-SCALE ASSEMBLY OF CHIP-SIZE PACKAGES

(75) Inventors: Katherine G. Heinen, Dallas, TX (US); Darvin R. Edwards, Garland, TX (US); Elizabeth G. Jacobs, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/186,973

(22) Filed: Nov. 5, 1998

(65) Prior Publication Data

US 2001/0044197 A1 Nov. 22, 2001

Related U.S. Application Data

(60) Provisional application No. 60/066,256, filed on Nov. 20, 1997.

(51) Int. Cl.$^7$ .............................................. H01L 21/60

(52) U.S. Cl. ...................................................... 438/108

(58) Field of Search ............................ 438/138, 1, 108; 257/737, 738, 778, 688, 700, 701, 702, 703, 780, 734

(56) References Cited

U.S. PATENT DOCUMENTS

| 4,202,007 A | * | 5/1980 | Dougherty et al. ........... 357/80 |
| 4,725,716 A | * | 2/1988 | Entwistle et al. ............ 219/388 |
| 4,922,377 A | * | 5/1990 | Matsumoto et al. ......... 361/387 |
| 5,012,047 A | * | 4/1991 | Dohya .......................... 174/250 |
| 5,250,469 A | * | 10/1993 | Tanaka et al. ................. 29/840 |
| 5,281,151 A | * | 1/1994 | Arima et al. .................. 439/68 |
| 5,331,514 A | * | 7/1994 | Kuroda ......................... 361/760 |
| 5,346,861 A | * | 9/1994 | Khandros et al. ............ 437/209 |
| 5,354,955 A | * | 10/1994 | Gregor et al. ................ 174/250 |
| 5,367,435 A | * | 11/1994 | Andros et al. ............... 361/749 |
| 5,367,764 A | * | 11/1994 | DiStefano et al. ........... 174/260 |
| 5,375,042 A | * | 12/1994 | Arima et al. ................. 361/784 |
| 5,396,034 A | * | 3/1995 | Fujita et al. ................. 174/261 |
| 5,451,274 A | * | 9/1995 | Gupta .......................... 148/512 |

(List continued on next page.)

Primary Examiner—George Fourson
Assistant Examiner—Suk-San Foong
(74) Attorney, Agent, or Firm—Frederick J. Telecky, Jr.; W. James Brady, III

(57) ABSTRACT

A wafer-scale assembly apparatus for integrated circuits and a method for forming the wafer-scale assembly are disclosed. A semiconductor wafer including a plurality of circuits is provided with a plurality of metal contact pads as electrical entry and exit ports. A first wafer-scale patterned polymer film carrying solder balls for each of the contact pads on the wafer is positioned opposite the wafer, and the wafer and the film are aligned. The film is brought into contact with the wafer. Radiant energy in the near infrared spectrum is applied to the backside of the wafer, heating the wafer uniformly and rapidly without moving the semiconductor wafer. Thermal energy is transferred through the wafer to the surface of the wafer and into the solder balls, which reflow onto the contact pads, while the thermal stretching of the polymer film is mechanically compensated. The uniformity of the height of the liquid solder balls is controlled either by mechanical stoppers or by the precision linear motion of motors. After cooling, the solder balls solidify and the first polymer film is removed. The process is repeated for assembling sequentially a wafer-scale patterned interposer overlying all of the solder balls and the wafer and contacting each solder ball with a soldered joint, and a second wafer-scale patterned film carrying solder balls contacting the interposer. In each process, the wafer is heated uniformly and rapidly and without moving it, the alignment is maintained during heating by mechanically compensating for the thermal stretching of the polymer film, and the uniformity of the height of the liquid solder balls is controlled by mechanical stoppers or position closed-loop linear actuators. The second film is removed after cooling. Other embodiments are also disclosed.

7 Claims, 7 Drawing Sheets

U.S. PATENT DOCUMENTS

| | | | |
|---|---|---|---|
| 5,477,933 A | * 12/1995 | Nguyen | 174/262 |
| 5,489,750 A | * 2/1996 | Sakemi et al. | 174/261 |
| 5,530,289 A | * 6/1996 | Hirano et al. | 257/723 |
| 5,573,174 A | * 11/1996 | Pekol | 228/219 |
| 5,613,033 A | * 3/1997 | Swamy et al. | 361/790 |
| 5,634,268 A | * 6/1997 | Dalal et al. | 29/840 |
| 5,800,184 A | * 9/1998 | Lopergolo et al. | 439/66 |
| 5,810,607 A | * 9/1998 | Shih et al. | 439/66 |
| 5,838,061 A | * 11/1998 | Kim | 257/686 |
| 5,854,534 A | * 12/1998 | Beilin et al. | 257/691 |
| 5,870,289 A | * 2/1999 | Tokuda et al. | 257/779 |
| 5,942,795 A | * 8/1999 | Hoang | 257/692 |
| 6,107,689 A | * 8/2000 | Kozono | 257/778 |
| 6,117,705 A | * 9/2000 | Glenn et al. | 438/106 |
| 6,184,066 B1 | * 2/2001 | Chino et al. | 438/118 |
| 6,187,601 B1 | * 2/2001 | Hu et al. | 438/15 |
| 6,249,046 B1 | * 6/2001 | Hasimoto et al. | 257/691 |
| 6,336,262 B1 | * 1/2002 | Dalal et al. | 29/25.42 |
| 6,432,744 B1 | * 8/2002 | Amador et al. | 438/108 |
| 6,446,855 B1 | * 9/2002 | Rich | 228/19 |
| 2001/0013423 A1 | * 8/2001 | Dalal et al. | 174/260 |

* cited by examiner

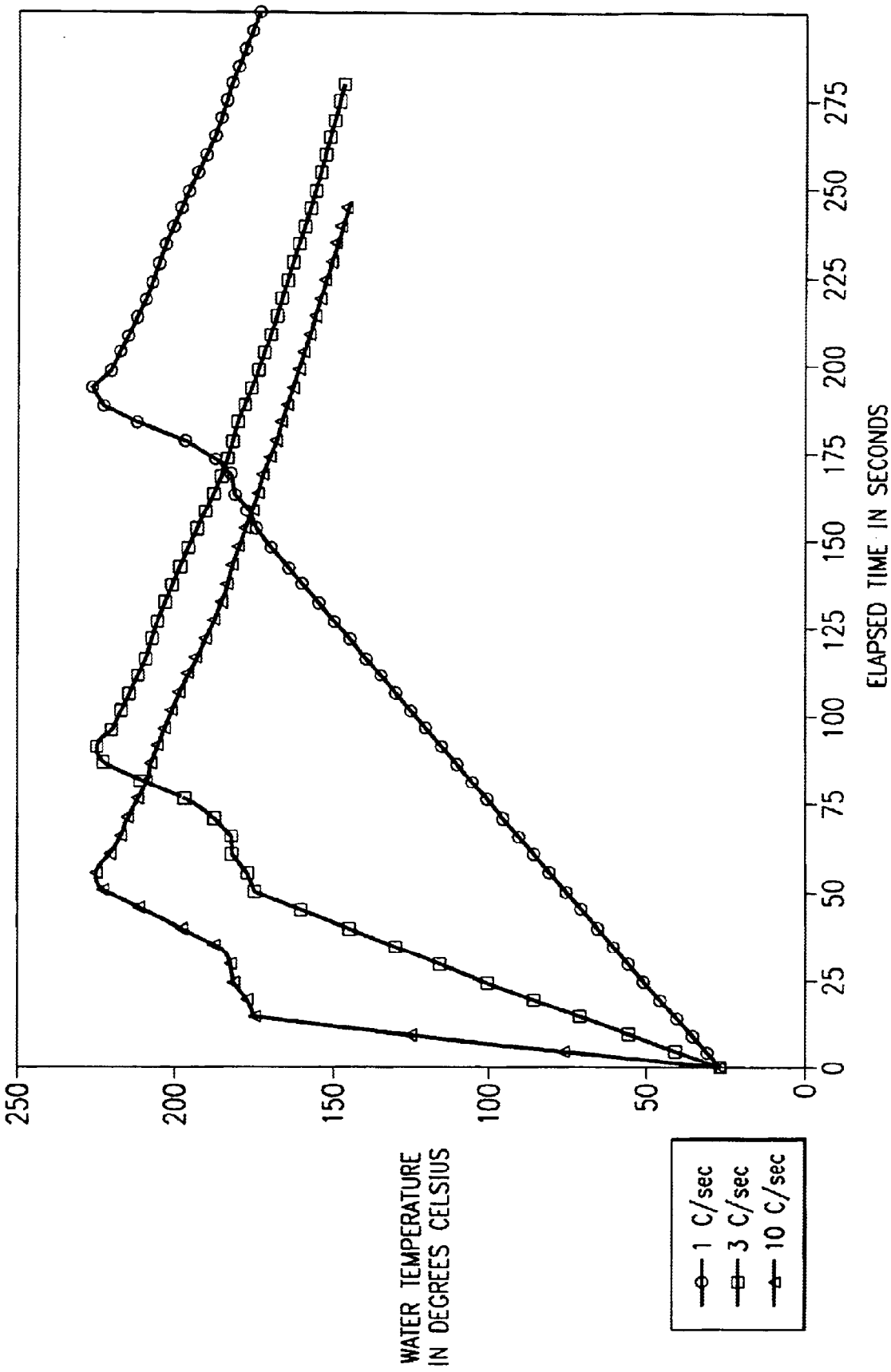

WAFER-SCALE ASSEMBLY OF CHIP-SIZE PACKAGES

This application claims the benefit of provisional application 60/066,256 filed Nov. 20, 1997.

This invention relates generally to semiconductor packaging and in particular to packaging of semiconductor circuits into chip size packages by a method compatible with wafer processing.

BACKGROUND OF THE INVENTION

The newest designs and concepts in microelectronics assembly and packaging are aiming for a package with a planar area not substantially greater than the silicon chip itself, or at most 20% larger area. This concept is known as Chip-Scale Package (CSP) and is finding particular favor with those electronics industries where the product size is continually shrinking such as cellular communications, pagers, hard disk drivers, laptop computers and medical instrumentation. Most CSP approaches are based on flip-chip assembly with solder bumps or solder balls on the exterior of the package, to interface with system boards.

A typical flip-chip process calls for solder-compatible contact pads on the circuit surface of the chip, and the deposition of solder bumps or balls thereon. The semiconductor wafers have to be separated into chips before flip-chip attachment to the board. Existing solder bump processes incorporate solder through metal masks, electroplated solder or screen printing a mound of solder paste onto each metallic contact. Typically the solder bumps are reflowed in a chain type furnace. Alternatively, solder balls may be placed on the chip pads and reflowed in a similar chain type furnace.

The chip-to-be-flipped may then be attached to a second interconnection surface such as an interposer, or alternatively, coupled directly to a printed circuit board (PCB). Attaching the flip-chip to the next interconnect is carried out by aligning the solder bumps or balls on the chip to contact pads on the second level interconnection and then performing a second solder reflow operation. During the reflow, the bumps or balls liquefy and make a bond to the next interconnect level which has pads or traces to receive the solder. Following the solder reflow step, flip-chips often use a polymeric underfill between the chip and the interposer or PCB to alleviate mechanical stress caused by the mismatch in the coefficients of thermal expansion (CTE) between the semiconductor chip, the interposer, if any, and the PCB. Many reliability problems occur due to the stress placed on the solder bumps or balls when the integrated circuit is cycled from hot to cool during operation. The interposers and underfills of the prior art are used to reduce or eliminate the mechanical stress generated by thermal cycling on the solder bumps or balls.

When another set of solder balls on the opposite side of the interposer is employed to complete the bonding process to a PCB, this second set may also be aligned and reflowed for attachment by the end user. When the chip is attached to the board as described, the final consumption of board area is usually not much larger than the area of the chip (about 20% larger). Consequently, this family of products is classified as "chip-scale packages".

Problems exist with conventional process equipment and flows for chip-scale packages using flip-chip technology. First, a typical solder bumping process is very equipment intensive. resulting in a large capital cost. Evaporation, plating and screening are environmentally unfriendly in that they make use of excess of solder, often containing lead. Both processing and clean-up costs are high in these operations.

Second, the manufacturing of flip-chip assembly can have a long cycle time. Typically, reflows which are carried out in infrared or forced convection ovens have cycle times of 5 minutes or longer. These furnaces are usually very long (>3 m) and massive structures, occupying much space on the assembly floor. Moving parts in such furnaces are a significant source of particulate contamination.

Third, present day assembly of flip-chips is processed in chip form. The assembly process starts after the chip has been diced from the wafer. This type of production strategy causes a disconnect between the wafer fabrication and test plant ("wafer fab") and the assembly and final test site because the dicing of the wafer must occur outside the clean room environment of a wafer fab. In addition, there are substantial costs in shipping valuable wafers worldwide. After packaging is completed in the assembly sites, the devices must undergo final testing before they can be shipped to the customer. A need thus exists for a packaging method that provides for wafer-scale assembly of integrated circuits, preferably in the clean room facility of the wafer fab itself.

SUMMARY OF THE INVENTION

In accordance with the present invention, there is provided first a multitude of semiconductor devices for application in board or systems assembly and multi-chip modules in digital signal processing, microprocessor, memory and other commercial and military products requiring flexibility, high reliability and cost-effectiveness; secondly a process aiming at low-cost manufacturability, far reduced number of process steps and easy rework, all of which offer an economic advantage over the prior art and also avoid the generation of chemical waste byproducts which would require costly disposition; and thirdly, an apparatus for aligning, reflowing and attaching solder balls to semiconductor devices at the wafer level. The process used is low in particulate generation, a clean process which may be incorporated into or placed adjacent to a wafer fabrication facility. The method provides for a wafer bumping interconnection for integrated circuit devices which is compatible with the wafer processing equipment already in use in the wafer fabs.

The invention also provides a method and apparatus for attaching a secondary interconnection onto solder balls of semiconductor devices at the wafer level. The use of interposers is known to provide increased reliability and mechanical performance when using solder ball flip-chip technology. The embodiment described herein provides a methodology for producing packaged devices at the wafer level and leaving only the dicing and symbolization steps to complete the integrated circuits. Because the interposers provide additional mechanical performance, higher performance units can be packaged at the wafer fab.

It is an object of the present invention to provide a low-cost method and system for packaging chip-size devices at the wafer level.

Another object of the present invention is to provide a method for clean processing compatible with the clean room facilities and equipment installed in the wafer fabs.

Another object of the present invention is to simplify assembly and testing requirements by eliminating the need to ship wafers to assembly/test sites for packaging and rather complete the products in the wafer fabs.

Another object of the present invention is to shorten the manufacturing cycle time for packaging and use computer control extensively for assuring process control.

Another object of the present invention is to simplify the assembly of semiconductor wafers by reducing it to two process steps, repeated several times sequentially: Aligning and heating.

Another object of the present invention is to minimize the cost of capital investment and the movement of parts and product in the equipment.

Another object of the present invention is to provide a technology for assembling integrated circuits while maximizing the number and minimizing the feature size of inputs/outputs.

Another object of the present invention is to develop a flexible, efficient, economical, mass producible technology for dense packaging of semiconductor chips.

These objects have been achieved by a mass production process using a combination of thin film carriers, plastic interposers, fine-geometry coupling members, computer-controlled rapid processing equipment, and a variety of solder combinations and melting temperatures. Various modifications have been employed for the assembly of silicon wafers as well as connective substrates.

The technical advance represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 shows a portion of a first plastic film with a first multitude of patterned adhesive areas, each populated by a single solder ball.

FIG. 2 shows a portion of a semiconductor wafer being first aligned to the plastic film so that each conductive pad on the circuit surface of the wafer faces a solder ball on the plastic film.

FIG. 3 illustrates the first heating of the wafer, together with the first film, while retaining their alignment in order to alloy the first solder balls to the circuit contact pads.

FIG. 4 shows the portion of the semiconductor wafer with the solder balls attached, after discarding the first plastic film, in a first embodiment of the invention.

FIG. 5 shows the portion of the semiconductor wafer, with first solder balls attached, being second aligned to an interposer so that each solder ball on the circuit surface of the wafer faces the electrically conductive entry port of the interposer.

FIG. 6 illustrates the second heating of the wafer, together with the interposer, while retaining their alignment in order to alloy the first solder balls to the interposer entry ports, in a second embodiment of the invention.

FIG. 7 shows the portion of the semiconductor wafer, with first solder balls and interposer attached being third aligned to a second plastic film with a second multitude of patterned adhesive areas, each populated by a single solder ball.

FIG. 8 illustrates the third heating of the wafer, together with the second film, while retaining their alignment in order to alloy the second solder balls to the interposer exit ports.

FIG. 9 shows the portion of the semiconductor wafer after discarding the second plastic film and thus finishing the assembly of the composite structure, in a third embodiment of the invention.

FIG. 10 illustrates the separation of the assembled composite structure into individual chip-size packages and the alignment of each unit to printed contact pads on an assembly board.

FIG. 16 shows an example of the temperature profile according to the apparatus and the method of the invention.

DETAILED DESCRIPTION OF THE PREFERRED EMBODIMENTS

The method and apparatus of the invention is first described with reference to a first preferred embodiment wherein preformed solder balls are arranged into a pattern matching the layout and spacing of the contact pads on the chip circuit surface in a semiconductor wafer, aligned to the contact pads, and then mechanically transferred as a unit. (It should be noted that the term "ball" is used throughout the description of this invention to refer to a finite body of material. In addition, it may often, but by no means always, have the additional connotation of approximately spherical shape; when used in conjunction with solder material after reflow, this finite body of material may rather have the shape of a half-dome, a truncated cone, or a cylinder with straight, concave or convex outlines. It is still referred to as a "ball".) Fusing the balls to the pads is accomplished with a reflow process in which the solder is heated above its melting temperature. To perform the reflow, this invention uses radiant heat from near infrared optical sources—for example tungsten halogen lamps—, which allows rapid thermal ramping with minimal thermal inertia, thus shortening processing time. The apparatus of the invention aligns the solder balls to the wafer contact pdas, provides a clean environment for the rapid and controlled heating of the balls, and makes provision for exhaust or selected atmosphere blanketing (such as nitrogen).

The semiconductor wafer comprises silicon, gallium arsenide, or any oher semiconductor material used in electronic device production. The metal contact pads of the semiconductor wafer comprise aluminum, copper a refractory metal, or a noble metal; the refractory metal comprises chromium, molybdenum, titanium, tungsten, or a titanium-tungsten alloy; the noble metal comprises palladium, gold, platinum or platinum-rich alloy, silver or silver alloy.

Figure 1:
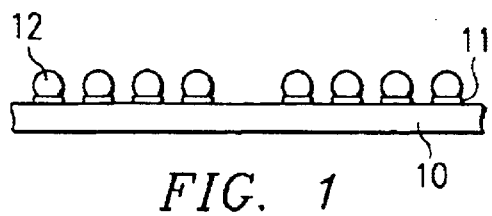
FIGS. 1 to 10 are cross sections to illustrate schematically the sequence of process steps for assembling chip-size packages on the wafer scale according to one embodiment of the invention.

FIG. 1 depicts a first film 10 (made of polymer plastic but may also be glass or quartz) which exhibits a pattern of adhesive areas 11, mirror imaging the contact pad locations of the integrated circuits on the wafer-to-be-processed. Solder balls 12 of approximately equal size are attached to the adhesive areas with one ball placed on each adhesive area. For defining the adhesive areas, a photolithographic patterning process may be used, for example as taught in U.S. Pat. No. 5,356,751. A photoimageable adhesive coating is formed on a polymeric film such as polyimide or Kapton™; however, other substrates such as Mylar™ or quartz could be used. The adhesive layer is exposed to light, ultraviolet radiation, or other appropriate energy sources through a photomask. Those areas exposed to the light or energy are polymerized and loose the tackiness of the adhesive. The unexposed areas remain tacky. The tacky areas are patterned to provide a match with the contact pads of the integrated circuits formed on the semiconductor wafer to be packaged. That is, the tacky areas form a mirror image of the contact pads on the wafer. After patterning, a single solder ball or alternatively a plurality of small solder balls is placed on each tacky area of the film or substrate. Such a process comprises the steps of providing a support surface having an array of tacky areas which have a size and bonding strength suitable for adhesion of particles or solder balls, and flowing the particles or solder balls across the support surface to allow particles to contact the tacky areas and adhere thereto. This solder ball attachment process is, however, only one of the available solder ball transfer techniques, and other appropriate techniques can be employed.

The solder balls are usually small in diameter, typically 0.1 to 0.12 mm with a range of ±0.01 mm envisioned for circuit contact pads on the wafer-to-be-assembled having typically a size of 0.13 mm squared. The diameter is being selected to provide good electrical contact to the circuit contact pads. The solder balls usually comprise tin or lead/tin alloys of various compositions, or other materials such as indium or indium/tin alloys. The balls must retain their shape in the handling stages, but be amenable to attachment to the wafer and the other interconnect areas by conventionally known solder reflow processes. Commercial suppliers for pre-fabricated solder balls are for instance Indium Metals. Utica, N.Y.; Alpha Metals, Jersey City, N.J.

Figure 14A:
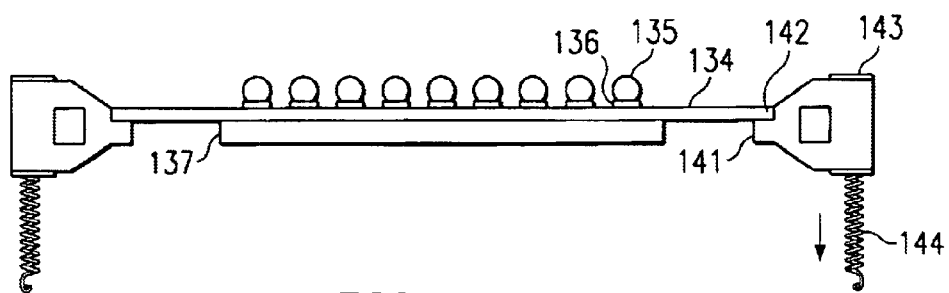
FIGS. 14A and 14B illustrate the mechanical compensation for the thermal stretching of plastic films during the heating and cooling cycles in the apparatus of the invention.
Figure 14B:
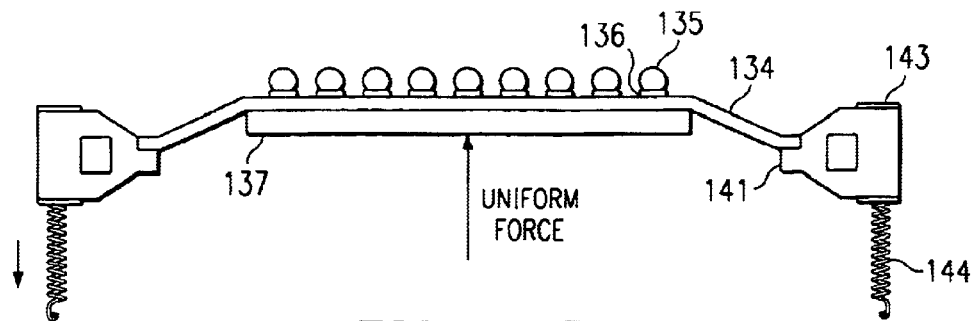

Methods to compensate mechanically for the thermal stretching of film 10 during the heating and cooling cycles will be described later in FIG. 14B. Film 10 is held flat throughout the process.

Figure 2:
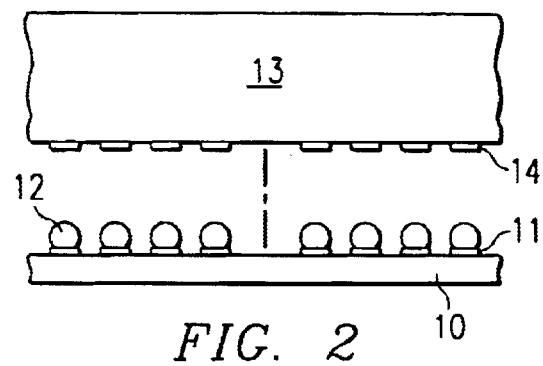

The first alignment step of the packaging process of the invention is depicted in FIG. 2. First film 10 with solder balls 12 on adhesive areas 11 is held flat by stretching (more detail about this important feature below in conjunction with FIGS. 13, 14A and 14B). Semiconductor wafer 13, to be assembled into chip-size packages having integrated circuits with metal contact pads 14 is moved into the space above film 10. The contact pads 14 and the solder balls 12 are vertically aligned to one another. Two cameras supply the vision system for alignment so that the alignment can be performed automatically; however, a miscroscope for visual inspection may be substituted. Alignment may be accomplished, for example, by rotating and translating the wafer. The apparatus of the invention exhibits six degrees of freedom, supplied by six motors, for performing the alignment steps: The three axes X,Y, and Z in space for position; Pitch (rotation about the X-axis), Roll (rotation about the Y-axis), and Yaw (rotation about the Z-axis) for orientation. For the alignment, flat film 10 is positioned parallel to the wafer 13. The height of film 10 with solder balls12 relative to the wafer 13 is dynamically controlled during the process. With this capability of modifying the apparatus, differences of wafer thickness and ball diameters are compensated for. Typical height control range is ±2 $\mu$m. After the alignment, five degrees of freedom are fixed and only one degree, the Z-axis, is still operational for controlling the bump uniformity in the heating step.

The contact pads 14 of the integrated circuits on wafer 13 are typically metallic; commonly used metals in the semiconductor industry are aluminum, copper, and gold. Often, refractory metals such as chromium, molybdenum, titanium, or titanium-tungsten alloy are used over nickel, copper, or gold; they may have a surface layer of solder-compatible metal such as palladium or platinum.

Figure 3:
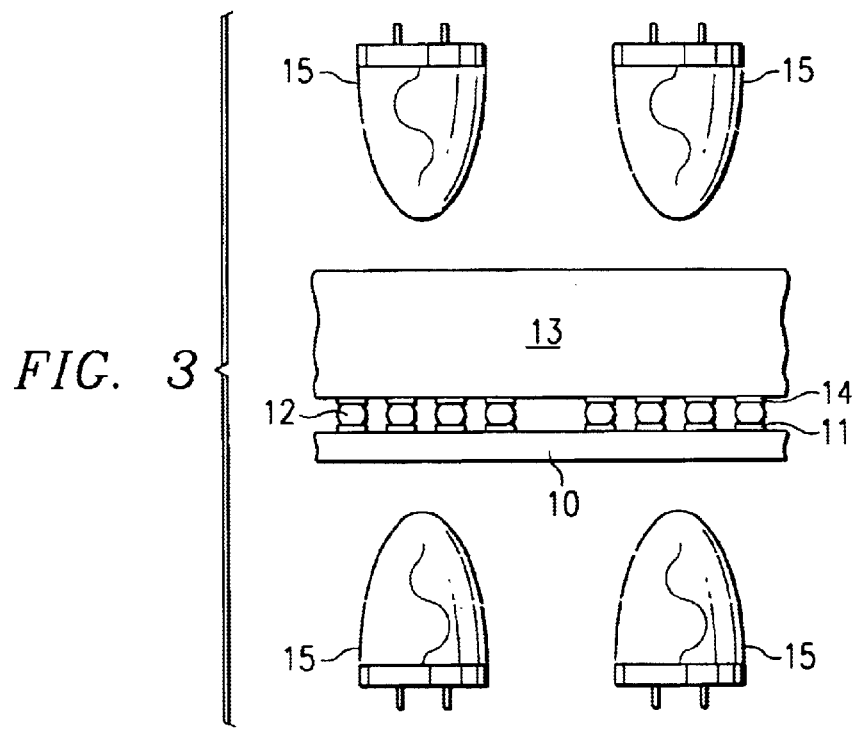

In FIG. 3, the first heating step is shown. Wafer 13 is brought into contact with the adhesive patterned film 10 having solder balls 12 so that the solder balls impact their respective contact pads 14 on the wafer. While the holder of film 10 has limited moving capability, the majority of movements, especially in the z-axis, is performed by the mechanism holding the wafer. Radiant heat is applied using tungsten halogen lamps 15. The positioning of these lamps is discussed in more detail below in FIG. 13; the energy is applied from the back of wafer 13. It is practical, however, to also preheat film 10—with mechanical compensation for the thermal stretching to be discussed in FIGS. 13, 14A and 14B—to maintain the alignment during the heating and cooling cycles. The tungsten halogen lamps are of the type described in related patent application Ser. No. 18425A, filed Mar. 25, 1996, titled "Optical Curing Process for Integrated Circuit Package", and assigned to Texas Instruments Incorporated. The radiant energy may be applied using the lamps alone, or using reflectors to enhance the efficiency. Non-contact or contact style thermocouples monitor the temperature on both the film and the wafer (positioning see below FIG. 13). The heating step of FIG. 3 may be performed, for example, in an inert gas environment, such as dry nitrogen or filtered gases, to provide for additional process control and to prevent particulates from settling on the wafer surface.

It is an important feature of this invention that the alignment and heating steps are performed in a single apparatus and in a single operation without moving and without the risk of losing the alignment, as could easily occur in a conventional chain furnace heating operation. The heating step follows and is combined with the alignment step, and does not just represents the heating of pre-assembled parts. In addition the use of radiant energy sources, as opposed to furnaces, allows rapid temperature ramping or profiling and also more uniform and more easily controllable heating and cooling cycles. Radiant heating allows a smooth transition from ambient temperature to the desired hot temperature, and rapid thermal response. The radiant energy is preferably provided by an optical heat source emitting near infrared light, such as incandescent lamps (halogen lamps with tungsten filament and xenon filling). For instance, silicon has been found to absorb rapidly near-infrared light, which is light having a wavelength of 0.8 to about 2.8 $\mu$m. Furthermore, selected reflective surfaces do not absorb near-infrared light, so that the heating can be restricted to the wafer itself; by using selected reflective surfaces on the carrier or other non-active areas exposed to the light the wafer can be heated while the remainder of the surfaces stay at a much lower temperature. Consequently, wafer 13 rapidly heats up to a temperature at which solder balls 12 begin to melt or reflow. This temperature is typically about 183° C. During the reflow, the solder will form a metallurgical bond with the top metal of the contact pads 14.

A typical flow chart of the heating and cooling cycles reveals the short time intervals needed for the processing steps. This feature of the invention is discussed below in conjunction with FIG. 16.

A closed loop temperature control strategy is employed to control the temperature profile of the wafer-under-assembly. The wafer temperature is changed by changing the voltage across the lamps, since the amount of heat produced by the lamps is proportional to its voltage. A temperature-sensing device is used to measure the real time/temperature of the wafer. This temperature is fed back to the controller which modifies the voltage across the lamps with respect to some mathematical function of the difference between the actual wafer temperature and the predeterminded desired wafer temperature.

It is an important feature of this invention to control the uniformity of the height of the molten solder balls. This is accomplished by the action of the three ultra-precision, independent Z axes Z1, Z2 and Z3, arranged 120° apart, which together control the Z height, Pitch and Roll of the wafer vacuum plate and thus the wafer (explained in FIG. 13 in more detail). The first step is to move the wafer towards the solid solder balls using axes Z1, Z2, and Z3, until the wafer makes contact with the balls. The coplanarity (pitch and roll) of the wafer to the balls is obtained by allowing each of the Z motors to independently "bottom out" against the plane of the solder balls. The "touchdown" of the wafer on the balls can be detected by the Z motor controller as a sudden change in the speed of descent of the axis. Next, the temperature profile is carried out. During the profile, at the time by which all the solder balls should be molten, the Z axis position is reduced to a height which is equal to the ball diameter minus the known variation of the ball diameters. This action guarantees that even the smallest diameter ball is in contact with the wafer. The diameter of the smallest ball is contained in the statistical variation and the ball diameter consistency as supplied by the vendor of the balls. Once it has been established that all balls are in contact with the wafer and sufficient time has passed so that all balls should be molten, the Z height is raised to the level at which the solder balls are desired to be solidified, the final ball stand-off height. At this height the temperature is reduced to below the solder reflow temperature and the solder balls all solidify. The height of all the solder balls will now be equal and each solder ball will have a small "flat" portion defined by the carrier film which is stretched against the flat quartz backup plate.

Figure 4:
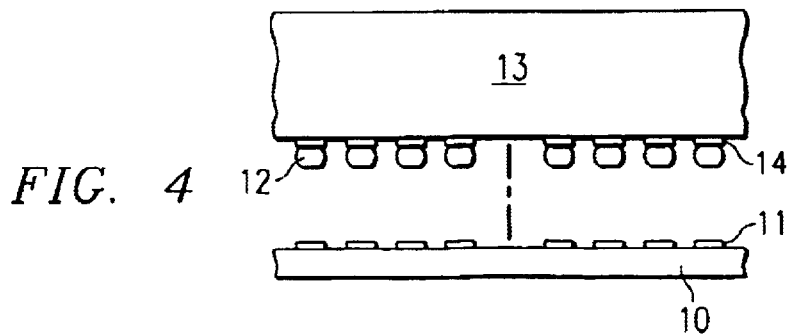

As shown in FIG. 4, plastic film 10 can be removed from the solder balls 12 after cooling because the adhesive releases the solder balls from the tacky areas 11. The whole array of solder balls 12 on the wafer contact pads 14 will now be coplanar, this means, exhibit uniform height independent of the shape and volume of the balls; the balls further have a flat top and the physical contact has the characteristics of a solder joint. An additional thermal excursion in order to achieve another solder reflow would achieve a more spherical contour of the balls, but sacrifice the coplanarity. If desired, the wafer can be tested at this stage and separated into individual chips (for example by sawing) for shipment to the customer. In the customer's house, the individual chips could undergo a reflow process similar to the one described above so that the chips with their solder balls are attached as "flip-chips" to the end user's circuit board ("Direct Chip Attach" process). Alternatively, existing reflow equipment could be used so that no change of the customer's process is required.

Figure 5:
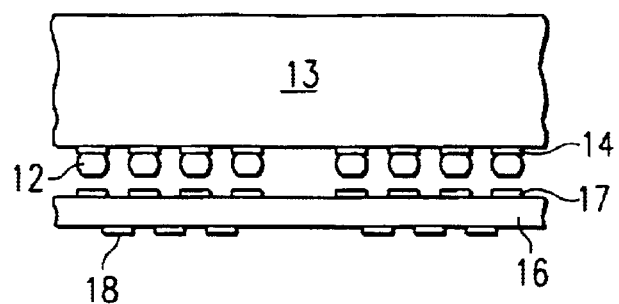

FIG. 5 depicts the continuation of the processing of wafer 13 with attached solder balls 12 according to the invention towards a second preferred embodiment. An interposer 16 of electrically insulating material having electrically conductive paths extending through this interposer from one surface to the opposite surface, forming electrical entry ports 17 and exit ports 18 on this insulating interposer, is now aligned over the solder balls 12 on wafer 13 (more detail of the interposer is discussed later in FIG. 11). To this purpose, the entry ports 17 of interposer 16 are patterned to mirror the solder balls 12 attached to the contact pads of wafer 13. Exit ports 18 are patterned to receive a second set of solder balls and to provide the final footprint of the packaged chip. The pattern of these exit ports 18 is determined by the customer's board attach requirement and will often be different from the pattern of the entry ports 17, which must mirror image the chip-specific contact pads of the wafer. Frequent reasons for this rerouting are the need to distribute incoming power lines to numerous use points of the circuit, to provide electrical ground potential to selected nods in the circuit, or to decrease the number of required contacts to the board. In the preferred embodiment, the ports are made of copper with gold flash; however other metal choices are acceptable. As described earlier in FIG. 1 for the polymer film carrying the solder balls, interposer 16 is likewise held flat throughout the process by stretching, with provision to compensate mechanically for the thermal stretching of interposer 16 during the heating and cooling cycles (see FIG. 12 later). Semiconductor wafer 13 is moved into the space above interposer 16. Solder balls 12 and entry ports 17 are vertically aligned to one another, for instance by rotating and translating the wafer. All six degrees of freedom supplied by the six motors of the apparatus of the invention may be utilized. Next, solder balls 12 are brought into physical contact with the entry ports 17.

In the preferred embodiment, the interposer is made of plastic material with elastic properties. These elastic properties, when preserved through the thermal excursions, will significantly reduce mechanical stress exerted on the solder balls by the thermal mismatch of silicon (CTE about 2.5 ppm) and board materials (typical CTEs are between 15 and 25 ppm).

Figure 6:
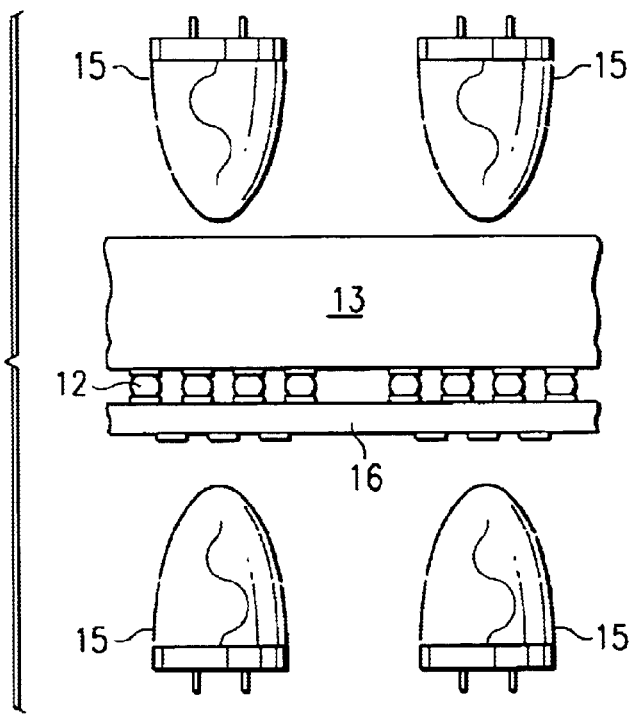

FIG. 6 depicts the reflow process as described above in FIG. 3 using radiant energy from lamps 15 to attach the interposer 16 to the solder balls 12. Near infrared energy is applied to the backside of the wafer 13 as well as to the interposer 16. As in FIG. 3, it may be practical to preheat the interposer 16, with mechanical compensation for the thermal stretching, to maintain the alignment. Also, the temperature ramping in the heating and cooling cycles is controlled, and fast. Again, the control of the plane and tension of the interposer, and the control of the temperature profile insure the accuracy of the process. When the solder balls reach the temperature at which they begin to reflow, a metallurgical bond is formed between the solder balls and the gold flash and copper of the entry ports of the interposer. After wafer and interposer have been cooled, they can be removed from the assembly apparatus.

At this stage, the wafer can be tested by contacting the exposed ports of the interposer and, if desired, be separated into individual units (for example by sawing) for shipment to the customer. The wafer-scale assembly at this stage may for instance be a multi-chip module on a wafer, where the interposer provides an off-chip interconnection scheme. On the other hand, processing can continue towards yet another embodiment of this invention.

Figure 7:
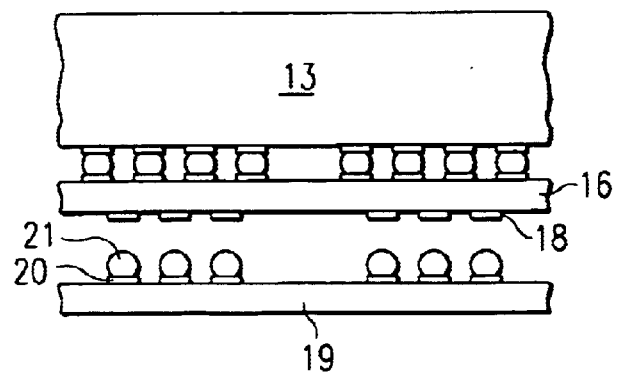

FIG. 7 illustrates the use of a second film 19 with patterned areas 20 to provide a second set of solder balls 21 for attachment to the exit ports 18 of interposer 16, leading towards a third preferred embodiment. Solder balls 21 may be similar to solder balls 12; in other applications, however, they may be different from solder balls 12 in number, size, composition and melting temperature. For instance, solder balls 21 may have a larger diameter than solder balls 12 or they may have a lower melting temperature. Polymer film 19 may comprise the same material (with regard to plasticity, thermal expansion, etc.) as film 10, or it may be different. Similar to film 10 in FIG. 1, film 19 has an array of adhesive areas 20, each one populated by a solder ball 21. For the alignment of film 19 and exit ports 18 of the interposer 16, attached to wafer 13, the apparatus of the invention offers the same flexible and controllable capabilities as described above for the alignment of film 10 and wafer 13, and the process of aligning follows the same steps as described above.

Figure 8:
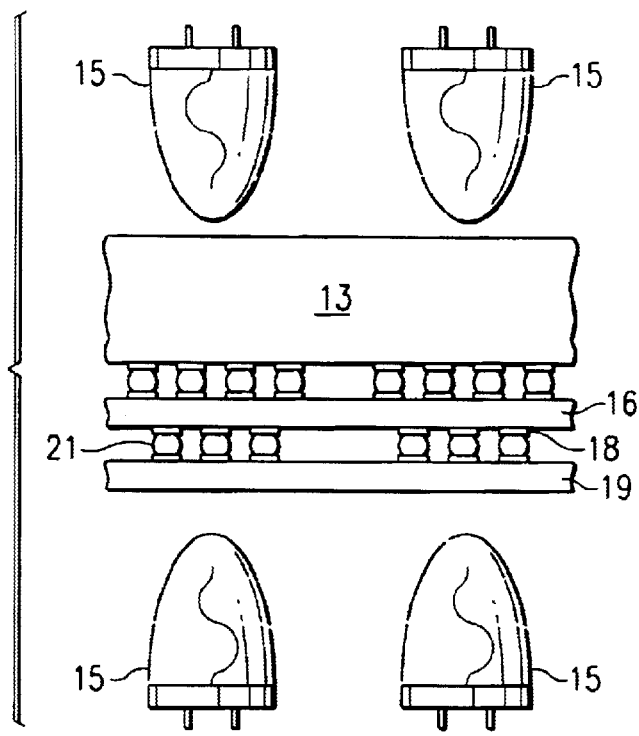

FIG. 8 depicts a reflow step similar to the one described in FIGS. 3 and 6. Optical sources 15 supply radiant energy of the near infrared range to heat the back sides of wafer 13 and film 19 for rapid temperature ramping. Typically in the temperature range of 183 to 250° C., solder balls 21 reach melting temperature and bond to the exit ports 18 of interposer 16. It is again important that the apparatus of this invention allows the control of the height uniformity of the molten solder balls. After the reflow is completed, the radiant energy is turned off, the balls quickly harden and form solder joints with the exit ports.

A flow chart of typical heating and cooling cycles, as discussed below in FIG. 16, again highlights the short time periods needed for the processing steps of the invention.

Figure 9:
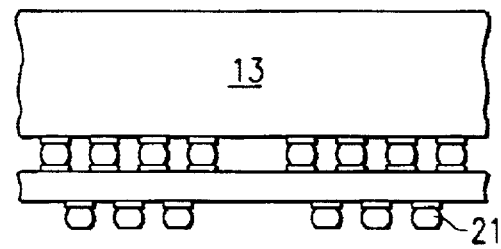

FIG. 9 shows the completed wafer-scale assembly, after polymer film 19 of FIG. 8 has been removed by physically pulling it away from the solder balls. The second array of solder balls 21 is coplanar, and the solder balls 21 have a flat top. If desired, a rounded ball configuration can easily be achieved by a short solder reflow process. The fully assembled wafer 13 may now be removed from the clean environment of the assembly apparatus, electrically tested, and then either shipped to the customer or further processed by separating the individual chips, for instance by sawing. They are now chip-size package devices. If desired, an plastic underfill material can be applied to fill the space between the solder balls and help reduce eventual mechanical stress in board assembly. These underfills are typically epoxies or other electrically insulating plastic materials; examples: Hysol 4527; Zymet X6-82-5.

Figure 10:
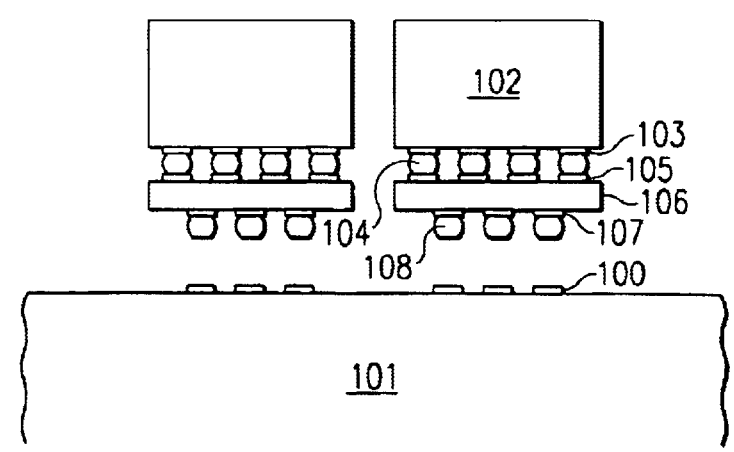

FIG. 10 depicts finished chip-size package devices, fabricated using the method of wafer-scale assembly described above, readied for assembly onto assembly pads 100 of circuit board 101. The chip-size package devices of FIG. 9 comprise a singulated semiconductor chip 102 having a set of contact pads 103 on the integrated circuit of the chip. A first set of solder balls 104, each solder ball coupled to one contact pad of the integrated circuit and one entry port 105 of an interposer 106. Interposer 106 comprises through connections (not shown in FIG. 10, but explained in FIG. 11) which couple the set of entry ports 105 to the set of exit ports 107. Finally, a set of larger package solder balls 108 is coupled to the interposer exit ports 107 to complete the packaged device.

Interposers provide electrical connection between the solder-bumped semiconductor chips and an assembly board (P.C. board), and in addition some mechanical flexibility to help preventing solder ball cracking under mechanical stress due to thermal cycling. The interposer is preferably made of compliant material, such as tape, Kapton™ film, polyimide, or other plastic material, and may contain single or multiple layers of conductors. In this fashion, the flexibility of the base material provides a stress buffer between the thermally mismatched semiconductor chip and the P.C. board, and will relieve some of the strain that develops in the chip solder balls in thermal cycling. An interposer can further provide a common footprint to industry standards for chip-size packages and may minimize the number of inputs and outputs by allowing common connections for power and ground within the interposer.

Figure 11A:
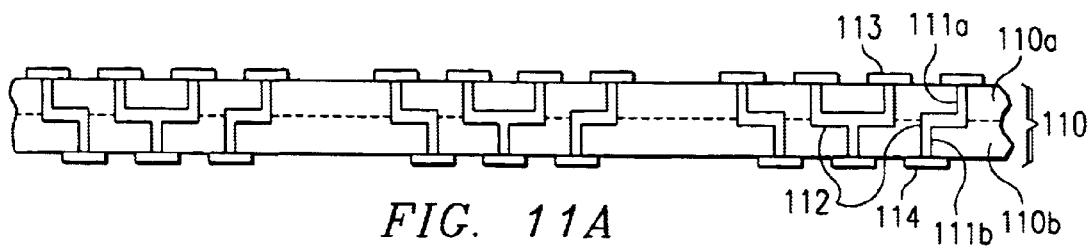
FIG. 11 shows the cross section of a simplified schematic detail of an interposer.

Interposers are commercially available, for instance Novaclad® and ViaGrid® from Sheldahl, Inc. Northfield, Minn. They are typically fabricated by laminating alternative films of electrically insulating and electrically conducting materials into one coherent layer. Connections through individual insulating films are made by laser drilling and metal refilling or plating, and patterning of the conductive films is achieved by ablation or etching. There are numerous designs and variations of interposers available. Two examples are schematically shown in cross sections in FIGS. 11A and 11B. FIG. 11A is a finished interposer with a five-layered structure. Originally separate insulating film 110a, having laser-drilled or etched via holes 111a filled or plated with metal such as copper has been fused with insulating film 110b, having laser-drilled via holes 111b filled or plated with metal such as copper, to form interposer layer 110. Metal film portions 112, needed to selectively interconnect via holes 111a and 111b, were originally one coherent metal film (such as copper) laminated onto one of the insulating films for patterning (by ablating or etching) into the film portions. Entry ports 113 and exit ports 114 of interposer 110 are also typically made of copper, often with a protective flash of gold.

Figure 11B:
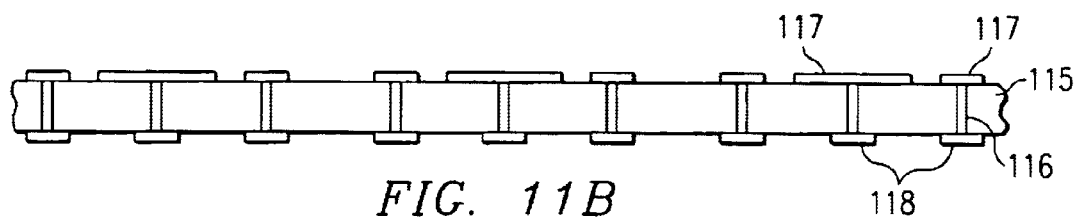

A simpler three-layered interposer is shown schematically in cross section of FIG. 11B. The interposer comprises only one insulating film 115, having etched or laser-drilled via holes 116, filled or plated with metal such as copper. A first film of metal, such as copper, has been laminated on one surface and patterned into areas 117 suitable to provide entry ports to the interposer and alloy sites for the solder ball connections to the wafer. A second metal film is laminated onto the opposite surface of the interposer and patterned into exit ports 118. Notice the design option of connecting several ports together so that the number of entry ports 117 will be different from the number of exits ports 118.

Alternatives to multilayered structures are flexible leads running through apertures formed in the insulating material, or wires running through the interposer. At any rate, the conductive paths through the interposer should also be somewhat flexible as to provide the ability to compensate for movement caused by thermal expansion of the materials that will occur as the packaged semiconductor chip is operated and becomes warmer than the remaining materials.

Figure 12:
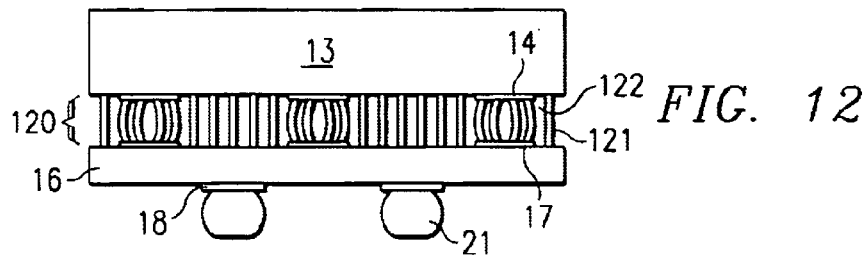
FIG. 12 depicts a Z-axis layer assembled to a semiconductor wafer, in a fourth embodiment of the invention.

A fourth preferred embodiment of the wafer-scale assembly of this invention is depicted in FIG. 12. The wafer 13 of integrated circuits is coupled to a material described in co-pending U.S. patent application Ser. No. 21111, filed Sep. 24, 1996, entitled "Microelectronic Assemblies Including Z-axis Conductive Films", and assigned to Texas Instruments Incorporated. This material, sometimes called nano-Z or Z-axis material, is an electrically insulating film with a multitude of electrically conductive fibers, or filaments or fibrils, extending through the film from one surface to the opposite surface (Z-axis), while remaining insulated from adjacent fibers. In FIG. 12, Z-axis layer 120 has numerous conductive fibers 121, fixed within uniaxial pores of the layer and preferably made of gold or copper. The fabrication of the pores follows known technology of the filter industry. The fibrils are very numerous and substantially perpendicular to the surfaces so that they provide a low electrical resistance path from one surface of the layer to the opposing surface. Electrical contact to a surface of the layer can be made either by pressuring a metallic object against a selected area of the surface (mash or melt technology), or by placing a contact pad on the surface of the film, or by solder reflow. The layer itself comprises thermoplastic or synthetic resin material 122, like a polymeric membrane. Preferably, layer 120 includes reliable adhesives so that in addition to providing thermal and electrical connectivity between pieces, layer 120 can cause parts of the assembly to adhere together. Furthermore, the coefficient of thermal expansion of the layer material will help reducing mechanical stress.

In FIG. 12. one surface of the Z-axis layer 120 adheres to circuit surface of semiconductor wafer 13 and makes reliable pressure contact to the wafer contact pads 14 (for instance made of gold or palladium overlaying titanium-tungsten alloy or copper). Again, the reflow process described earlier, comprising aligning and heating using the apparatus and method of this invention, is performed each time in order to attach wafer 13 first to the Z-axis layer 120, then to the entry ports 17 of interposer 16, and finally to the array of solder balls 21 joining the exit ports 18 of interposer 16. In FIG. 12, the entry ports 17 of interposer 16 mirror the contact pads 14 on wafer 13 so that the Z-axis layer provides an electrical and thermal path to the interposer. Due to the slightly narrower distance between contact pads 14 and entry ports 17, compared to the distance circuit surface to the interposer surface, the fibrils between those metallic pads may be slightly deformed, indicating good mechanical and electrical contact. As before, the solder balls 21 are provided by a film with adhesive areas, which is discarded after completion of the reflow step, leaving solder balls 21 with uniform height and a flat top.

After completion of the wafer-scale assembly, the individual integrated circuit packages can be singulated by a sawing process or other singulation technique, as known in the art.

The following description of the apparatus and method of the invention is based on a specific preferred embodiment thereof; however, to those skilled in the art, many variations and modifications will become immediately apparent. It is, therefore, understood that other apparatus and method designs may also work.

Figure 13:
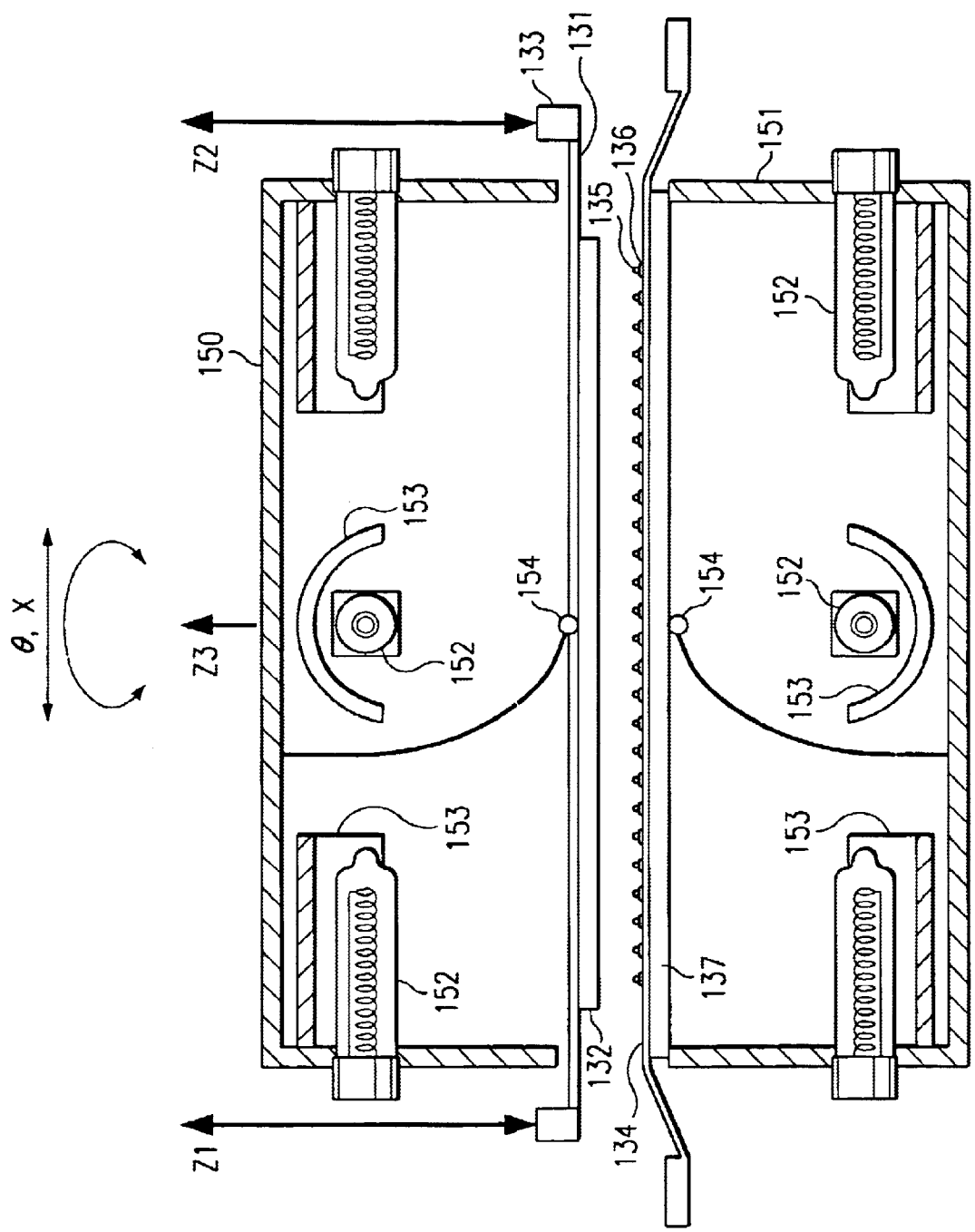
FIG. 13 shows schematically the apparatus used for alignment and heating of wafers.

In order to explain key features of the apparatus used for wafer-scale assembly according to the invention, FIG. 13 shows schematically the alignment and heating equipment in its automated version, referred to as Wafer Rapid Thermal Processing (WRTP) system. It provides a vacuum chuck through quartz vacuum plate 131 to support wafer 132 in place during processing; possible damage to the delicate wafer is thus greatly reduced. Frame 133 which holds vacuum plate 131 is moveable in the Z-axis with Z1, Z2 and Z3 being independent. With the mechanical and thermal mass of frame 133 and plate 131 together being small, the position of the wafer in the Z-axis is dynamically. i.e. automatically, controlled. Three independent linear axes with closed loop position feedback are used to control the planarity of the wafer to the film substrate as well as the final solder ball stand-off height. With the motorized linear Z-axis, the height can be changed throughout the reflow process to optimize the process. This enables, for instance, a larger stand-off height as the flux vapor (if flux is used) is being driven off; a small stand-off height at the reflow temperature to insure that all solder balls are contacting their respective targets (taking care of small balls); and a final stand-off height to create truncated balls or taller columns. The motorized Z-axis easily compensates for wafers that vary in thickness from one another. The wafer thickness can be known a priori (read electronically from the data base connected to the wafer-under-process); measured by the machine itself ( using a non-contact laser displacement sensor such as is manufactured by Keyence Corp.); or not known at all, with the surface being located automatically using the three axes independent "touchdown" detection described previously. Once the wafer thickness is known or the surface has been detected, the programmed process Z heights are automatically adjusted.

Opposite and substantially parallel to wafer 132 is plastic film 134 (maybe with solder balls 135 attached through tacky areas 136, as shown in FIG. 13, or maybe as the interposer). supported by quartz plate 137. The overall film frame assembly is depicted in more detail in FIG. 14A. It allows the film 134 to be handled more easily without damage and has three components: A flat film frame 141; an adhesive layer 142 between frame 141 and film, and plastic film 134 itself (instead of the pattern of tacky areas 136 with solder balls 135 attached, film 134 may comprise an interposer). Film 134 is stretched over frame 141 at room temperature using thin adhesive 142 (for instance, double coated tape). Quartz plate 137 is a polished flat disk on the back side of film 134. Its purpose is to present a flat hard surface as a backup plate for film 134, which insures that film 134 does not wrinkle at high temperature.

Film frame holders 143 are loaded by a force (as applied by springs 144, or air cylinders, or solenoids, etc.) against fixed plate 137. The resulting force on the film frame 141 acts to take up excess film from thermal growth of film 134 at high temperatures (see FIG. 14B). This feature is especially important during solder reflow.

In designing the patterns of the tacky dots or the interposer ports, a shrink at room temperature is designed-in so that the patterns have the correct size at solder melting temperatures. At those high temperatures, the films will grow more than the silicon and the scaled patterns will match the wafer pads, but there will be more film material within frame 141 than at room temperature (frame 141 is not heated). By loading the film frame holder 143 with the springs 144 the film frame 141 is constantly being pulled down, away from the film stretched against the fixed quartz backup plate 137. As the film grows during heating, frame 141 is lowered and the excess film material resulting from thermal growth is stretched away, retaining the flat film surface.

The magnitude of change with temperature of the tacky dot pattern depends radially on the position relative across the wafer; quantitatively: delta growth=temperature delta× delta CTE×length. As approximate examples, delta CTE between silicon and Kapton™ is 12 ppm. For a 100 mm diameter silicon wafer and eutectic solder balls of 183° C. melting temperature, the delta growth requires a 99.81% scaling factor to match at 183° C., i.e., 0.192 mm.

Figure 15A:
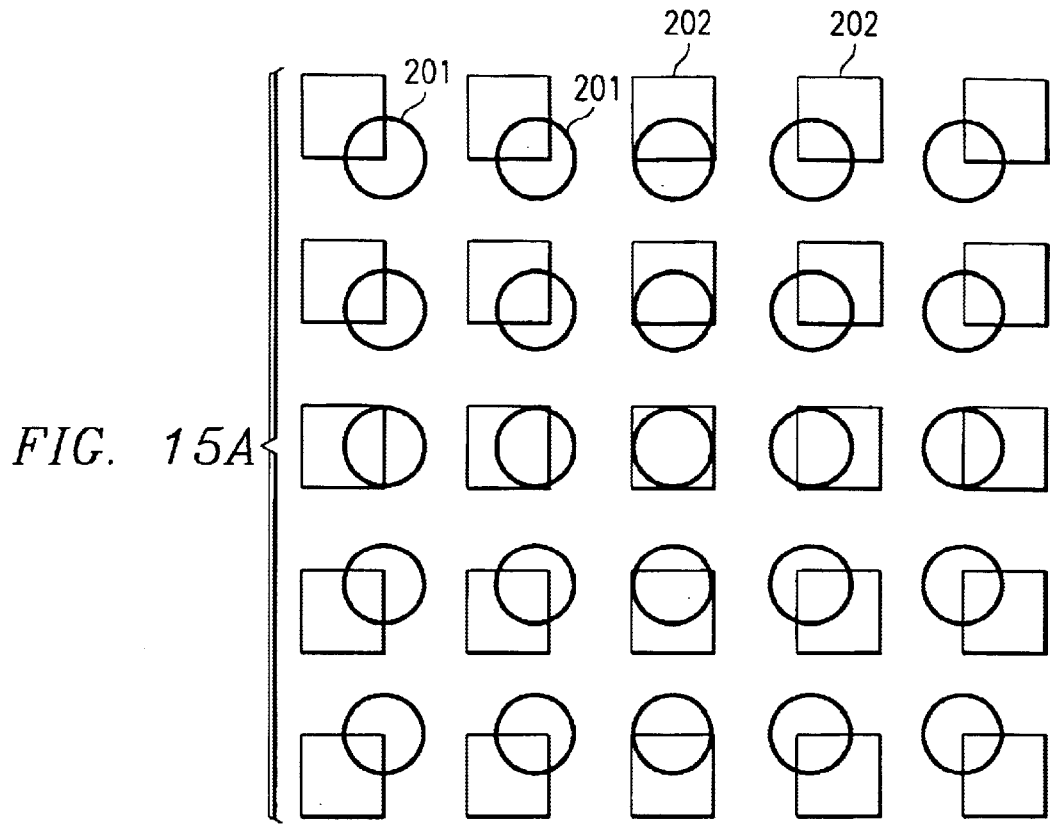
FIGS. 15A and 15B illustrate the comparison of the tacky dot pattern on a plastic film at room temperature and solder reflow temperature, according to the invention.
Figure 15B:
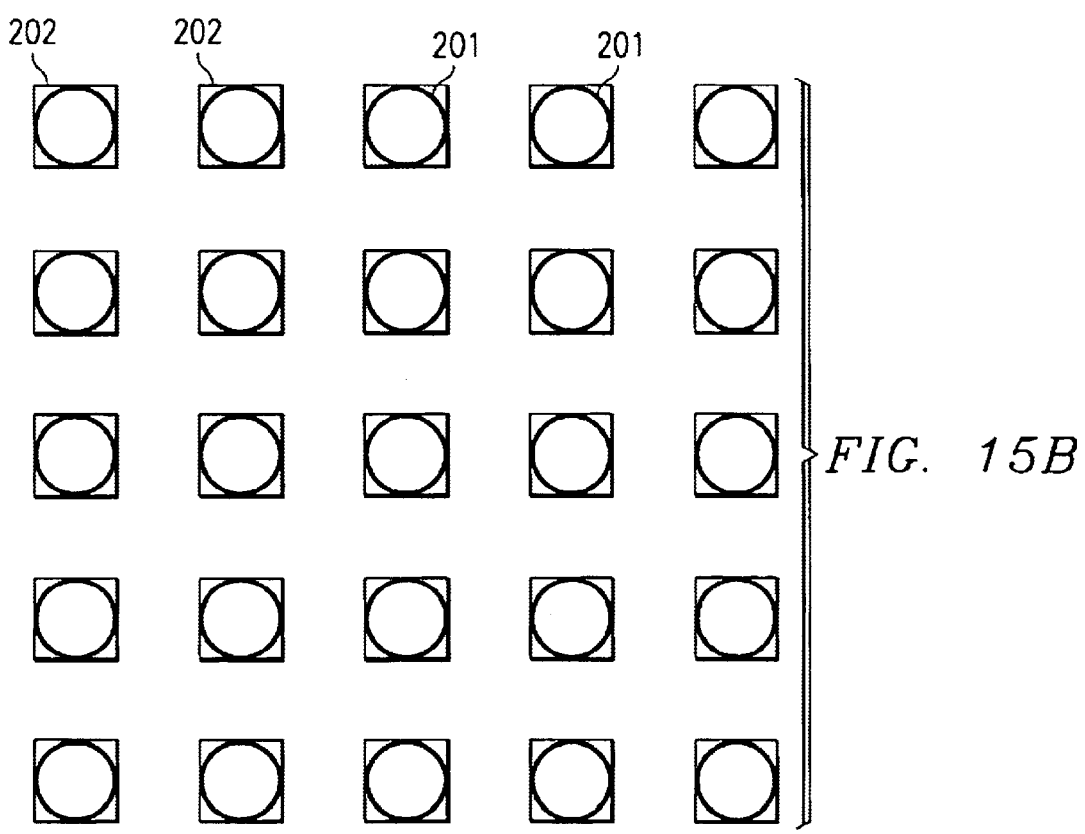

This thermal growth of a tacky dot Kapton™ film loaded with eutectic solder balls can be compensated for in the film pattern, as shown in FIGS. 15A and 15B. In FIG. 15A, the scaled tacky dot pattern (circles 201 )(exaggerated) is layed over the corresponding target site pattern (squares 202) at room temperature, while in FIG. 15B the scaled tacky dot pattern (circles 201) is layed over the corresponding target site pattern (squares 202) at 183° C. The film pattern is shrunk so that at room temperature the amount of mismatch between the film and target is equal to the delta thermal growth that will occur at the process temperature. With the scaling factor, the pattern will be undersized at room temperature.

For small mismatch, the wafer and a properly scaled film pattern can be aligned at room temperature. The center balls are exactly placed on the corresponding center sites. As the distance from the center increases and the balls gradually fall short of the corresponding targets, the alignment is done so that all balls at the same distances from the center are equally off their corresponding targets (see FIG. 15A). As the reflow profile proceeds, the film and wafer heat up and grow linearly with temperature. At 183° C., the patterns match up exactly and the solder ball transfer takes place.

For larger mismatch at larger diameter wafers, the preferred embodiment of the invention uses a film preheater, as indicated in FIG. 13. This preheater raises the temperature of the film to a temperature closer to the final process temperature prior to the alignment of the film to the wafer so that the majority of the film's thermal growth can take place prior to mating of the two surfaces.

As FIG. 13 indicates, the wafer support system (quartz plate 131 and frame 133) can move in the independent axes Z1, Z2, and Z3, together realizing Z, Pitch and Roll of the wafer quartz vacuum plate 131. The wafer reflector assembly 150, upon which is mounted the wafer support system, moves in X-axis and Theta. Plastic film 134, quartz plate 137, and film reflector assembly 151 form a unit and move in Y-axis. Low Z-axis moving mass is critical for system performance. The accuracy of the ball touchdown detection and ball height control are dependent on the apparatus that moves in Z. In the preferred embodiment, the only parts that move are the thin quartz vacuum plate 131 (1.59 mm thick) and the thin, rigid tool steel ring 133 that supports the quartz plate. Together these two parts weigh only about 0.45 kg, but are supported by three Z motors. The connections of the tool steel ring 133 to the Z motors' moving axes are through small, low thermally conductive mounts. These mounts limit the thermal conduction out of the quartz plate and support ring and into the motor shafts, hence the motor. Limiting the thermal transfer to the motor shafts helps to retain the temperature uniformity within the quartz plate 131 and helps to preserve the accuracy of the Z-axis system by maintaining the Z-motor housing temperature. The temperature of the actuators must be maintained since critical alignment of internal Z-motor components may be affected by thermal growth.

The combination the invention uses of the low moving mass and high accuracy independent Z-axis actuators arranged 120° apart with the touchdown detection software control algorithm provides a means that allows ultra-high precision detection of touchdown and ultimate control of final ball height that is truly state-of-the-art.

Alignment in the WRTP system is preferably accomplished automatically. The WRTP may use a machine vision system incorporating two cameras to find the relative position of the wafer to the plastic film in X, Y and Theta. One camera faces the wafer and another one faces the film. Pictures of each substrate are taken and pattern recognition algorithms discern the taught patterns and calculate the relative positions of one substrate to the other. Once the relative positions of the two substrates are known, the machine controller can automatically bring the two substrates into contact so that the patterns of interest on the wafer match up with the corresponding patterns on the plastic film. Closed loop motorized stages are used to move the two substrates relative to each other in X, Y, and Theta with the Z height. Pitch and Roll being controlled by the three servo axes described above.

FIG. 13 furthermore illustrates that the WRTP uses two heater elements to help compensate for differences in CTE. One heater element, the wafer reflector assembly 150, is used to support and heat the semiconductor wafer 132 to processing temperatures; the other heater element. the plastic film reflector assembly 151, is used to support and heat the plastic films 134 and interposers to processing temperatures. Each of these two categories of "substrates" is preheated to an elevated temperature (about 75 to 80% of solder reflow temperature) prior to contact so that alignment can take place at elevated temperatures. Pre-heating the substrates allows them to expand thermally before alignment is performed. hence this mismatch due to CTEs is minimized.

FIG. 13 illustrates schematically the distribution of tungsten-halogen heating lamps 152 and reflectors 153 to generate a substantially evenly distributed heating profile both in the wafer reflector assembly 150 and the plastic film reflector assembly 151. Also shown in FIG. 13 are the temperature-sensing devices 154 mentioned above; for example, they may comprise thermocouples.

The preferred embodiment of the apparatus of the invention selects its parts based on certain criteria for materials, thermal mass, physical properties (such as optical reflectivity, surfaces and thermal conductivity), and design features (such as thickness and dimensions), since materials selection and design considerations are of great importance with respect to the efficiency and effectiveness of the apparatus (heating the target and not the apparatus itself). The basic heating element is a tungsten halogen lamp which emits near-infrared radiation. The material for the individual lamp reflectors and for the overall assembly housing should be made of material that is very reflective and not absorbing in this wavelength, as well as highly polished to enhance reflectivity.

In the preferred embodiment for rapid temperature profiling, the reflector assemblies are constructed to be especially low mass, utilizing a lightweight rigid skeleton with a thin sheet metal reflector surface. The interior of the reflective surfaces are highly polished aluminum (high reflectivity and low absorption in the wavelength range used). The exterior surfaces of the reflective components are treated for high temperature-compatible dark surfaces, increasing emissivity and re-radiation from the exterior surfaces, hence faster cooling capability of the reflector assembly.

In order to maintain uniform temperature across the wafer and across the film during the heating cycle, the diameter of quartz plates 131 and 137 should be preferably larger (approximately 25% to 35%) than the wafer and film diameter, respectively. This puts the wafer (or film) inside the temperature gradient located at the outside edge of the quartz plate, resulting in uniform temperature distribution. For instance, typical temperature uniformity across a wafer diameter at the temperature of melting solder is approximately ±5° C. for a 200 mm diameter wafer.

As an example for a typical heating profile in the apparatus of the invention, FIG. 16 plots the wafer temperature (° C.) as a function of elapsed heating time (s). As FIG. 16 shows, the heating profile of the WRTP is rapid. Three typical ramp rates are depicted: 1° C./s, 3° C./s, and 10° C./s, but temperature profiles with ramp rates as low as 0.25° C./s and higher than 10° C./s have been found useful, dependent on the diameter of the wafer and the choice of the solder alloys. After an original linear temperature rise, the small plateau at 175° C. indicates the evaporation of solvents and the profiles become the same. As these exemplary profiles demonstrate, WRTP can shave 2 min or more off the conventional solder reflow process, which typically uses 1° C./s to 3° C./s.

During the reflow process of the invention, there are effectively no moving parts in the apparatus of the invention. Consequently, no particles are generated which could adversely affect the functioning of semiconductor product. On the other hand, the apparatus of the invention lends itself to performing all processes in a controlled environment such as controlled ambient air, nitrogen. partial vacuum or high vacuum. The apparatus and the assembly process of the invention are fully compatible with clean-room environment and practices of even the most advanced semiconductor wafer fabs.

The description of the preceding FIGS. make the advantages of the WRTP evident when compared to conventional infared of forced air convection furnaces. Alignment and heating are performed in the same equipment, thus avoiding loss of alignment during moving and handling. The WRTP is designed with very little thermal mass so that substrate heating and cooling cycle times are minimized. The complete processing of chip-size packages can be performed in a single piece of apparatus which is sufficiently clean for clean-room operations. The WRTP process has been shown to be particle-free for most applications. Exhausting of fumes can be provided. Gases may be introduced to flood the process atmosphere. The WRTP apparatus is small and requires much less floor space compared to conventional fabrication equipment. The WRTP process is flexible with regard to solder and other materials to be used, since processing temperatures can be easily programmed and controlled. The overall cycle time for fabricating chip-size packages is reduced from days to minutes.

Since the invention has been described with respect to a specific preferred embodiment thereof and many variations and modifications will immediately become apparent to those skilled in the art, it is the intention that the appended claims be interpreted as broadly as possible in view of the prior art to include all such variations and modifications.

What is claimed is:

1. A method for the fabrication of a semiconductor assembly comprising:

providing a semiconductor wafer comprising a plurality of undivided integrated circuit chips on a first surface of said wafer, each circuit chip having a plurality of metal contact pads as electrical entry and exit ports;

forming a planar array of solder balls attached to said contact pads of said plurality of chips on said semiconductor wafer so that each of said contact pads is contacted by one of said solder balls;

providing an interposer of electrically insulating material having first and second opposite surfaces and electrically conductive paths from said first surface to said second surface, said conductive paths forming electrical entry and exit ports on said insulating interposer;

applying radiant energy from a first energy source to said interposer and then aligning said interposer with said solder balls so that each port is placed into alignment with one of said solder balls on said semiconductor wafer;

contacting said ports and said solder balls;

applying directed radiant energy form a separately controlled second source to a second surface of said semiconductor wafer such that said wafer increases uniformly in temperature and transfers heat to said solder balls, causing the solder balls to reach a liquid state, said step of applying directed radiant energy form a separately controlled second source performed during said step of applying radiant energy form a first energy source to said interposer;

removing said energy such that said solder balls cool and harden, forming physical bonds between said solder balls and said ports; and separating the resulting composite structure into discrete chips.

2. A method for the fabrication of a semiconductor assembly comprising:

providing a silicon semiconductor wafer comprising a plurality of undivided integrated circuit chips on a first surface of said wafer, each circuit chip having a plurality of metal contact pads as electrical entry and exit ports;

forming a first planar array of solder balls attached to said contact pads of said plurality of chips on said semiconductor wafer so that each of said contact pads is contacted by one of said solder balls;

providing an interposer of electrically insulating material having first and second opposite surfaces and electrically conductive paths from said first surface to said second surface, said conductive paths forming electrical entry and exit ports on said insulating interposer;

applying radiant energy from a first energy source to said interposer and then aligning said interposer with said solder balls so that each port is placed into alignment with one of said solder balls on said semiconductor wafer;

contacting said ports and said solder balls;

applying directed radiant energy form a separately controlled second source having a wavelength of 0.8 to 2.8 $\mu$m to a second surface of said semiconductor wafer such that said wafer increases uniformly in temperature and transfers heat of said solder balls, causing said solder balls to reach a liquid state, said step of applying directed radiant energy form a separately controlled second source performed during said step of applying radiant energy from a first energy source to said interposer;

said wavelength of said second source causing the wafer to heat more rapidly than said interposer;

removing said energy such that said solder balls cool and harden, forming physical bonds between said solder balls and said ports;

forming a second planar array of solder balls attached to said exit ports of said interposer so that each of said exit ports is contacted by one of said solder balls; and separating the resulting composite structure into discrete chips.

3. A method for fabrication of a semiconductor assembly comprising:

providing a semiconductor wafer comprising a plurality of undivided integrated circuit chips, each circuit chip having a plurality of metal contact pads as electrical entry and exit ports, said contact pads arranged at a first spacing pitch;

providing an adhesive layer adjacent said wafer, said adhesive layer having first and second opposite surfaces and a multitude of electrically conductive fibers extending through electrically nonconductive material from said first surface to said second surface of the layer while remaining insulated from adjacent fibers, said fibers arranged in said adhesive layer at a second spacing pitch, said second pitch being smaller than said first pitch;

providing an interposer of electrically insulating material having first and second opposite surfaces and electrically conductive paths from said first surface to said second surface, said conductive paths forming electrical entry
and exit ports on said insulating interposer;
    placing said interposer vertically and in contact with said adhesive substrate;
    providing a polymer film having a plurality of discrete adhesive areas;
    providing a plurality of solder balls, one of said solder balls being placed on each of said adhesive areas;
    aligning said polymer film to said interposer so that each of said solder balls is placed into alignment with one of said ports;
    placing said solder balls in contact with said ports;
    applying radiant energy to said semiconductor wafer such that said wafer uniformly increases in temperature and transfers heat to said adhesive substrate, said interposer and said solder balls, causing said solder balls to reach a liquid state;
    separately controlling the temperature of said interposer in order to minimize difference in thermal expansion;
    removing said energy such that all said contacts form physical bonds and said solder balls cool and harden, forming physical bonds between said solder balls and said ports;
    removing said polymer film; and
    separating the resulting composite stricture into discrete chips.

4. The method according to claim 1, claim 2, or claim 3 wherein said solder balls comprise at least one alloy with a melting temperature compatible with multiple reflow.

5. The method according to claim 1, claim 2, or claim 3, wherein said wafer contact pads, said solder balls, and said interposer ports comprise a combination of materials such that metal interdiffusion is minimized.

6. A method as in claim 1, wherein said step of applying radiant energy to said interposer heats said interposer to a temperature in the range of 75 to 80 percent of the temperature that causes said solder balls to reach a liquid state.

7. A method as in claim 2, further including the step of preheating said interposer prior to alignment with the wafer.

* * * * *